(12) United States Patent  
Alperovich et al.

(10) Patent No.: US 6,408,172 B1
(45) Date of Patent: Jun. 18, 2002

(54) SYSTEM AND METHOD FOR DELIVERY OF LOW BATTERY INDICATOR FOR EMERGENCY CALLS

(75) Inventors: Vladimir Alperovich, Dallas, TX (US); Gunnar Borg, Stockholm (SE)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/405,435

(22) Filed: Sep. 23, 1999

(51) Int. Cl.[7] .............................................. H04M 11/00
(52) U.S. Cl. ........................ 455/404; 455/521; 455/522; 455/439
(58) Field of Search ................................. 455/404, 521, 455/572, 571, 127, 38.3, 517, 522, 69, 525, 436, 439

(56) References Cited

U.S. PATENT DOCUMENTS

| | | | | |
|---|---|---|---|---|
| 4,622,544 A | * | 11/1986 | Bially et al. ................ | 340/636 |
| 5,870,685 A | * | 2/1999 | Flynn .......................... | 455/573 |
| 5,974,327 A | * | 10/1999 | Agrawal et al. ............ | 455/452 |
| 6,044,249 A | * | 3/2000 | Chandra et al. ............. | 455/62 |
| 6,052,574 A | * | 4/2000 | Smith, Jr. ................... | 455/404 |
| 6,072,784 A | * | 6/2000 | Agrawal et al. ............ | 370/311 |
| 6,148,190 A | * | 11/2000 | Bugnon et al. ............. | 455/404 |
| 6,192,245 B1 | * | 2/2001 | Jones et al. ................. | 455/437 |

* cited by examiner

Primary Examiner—Vivian Chin
Assistant Examiner—Duc Nguyen
(74) Attorney, Agent, or Firm—Jenkens & Gilchrist, P.C.

(57) ABSTRACT

A telecommunications system and method is disclosed for providing a battery status indicator associated with a calling mobile station (MS) during an emergency call setup. The battery status indicator is transmitted to the emergency center as a new parameter or as a modified existing parameter, such as cell ID. The emergency center can provide special handling for such calls, such as displaying the low battery indicator to the emergency operator. In addition, the cellular network serving the MS can handover the call to a cell with lower power demands in order to prolong the battery life.

17 Claims, 6 Drawing Sheets

SYSTEM AND METHOD FOR DELIVERY OF LOW BATTERY INDICATOR FOR EMERGENCY CALLS

BACKGROUND OF THE PRESENT INVENTION

1. Field of the Invention

The present invention relates generally to telecommunications systems and methods for placing emergency calls within a cellular network, and specifically to placing emergency calls within a cellular network depending upon the battery state of the mobile station.

2. Background and Objects of the Present Invention

Cellular telecommunications is one of the fastest growing and most demanding telecommunications applications. Today it represents a large and continuously increasing percentage of all new telephone subscriptions around the world. A standardization group, European Telecommunications Standards Institute (ETSI), was established in 1982 to formulate the specifications for the Global System for Mobile Communication (GSM) digital mobile cellular radio system.

Figure 1:
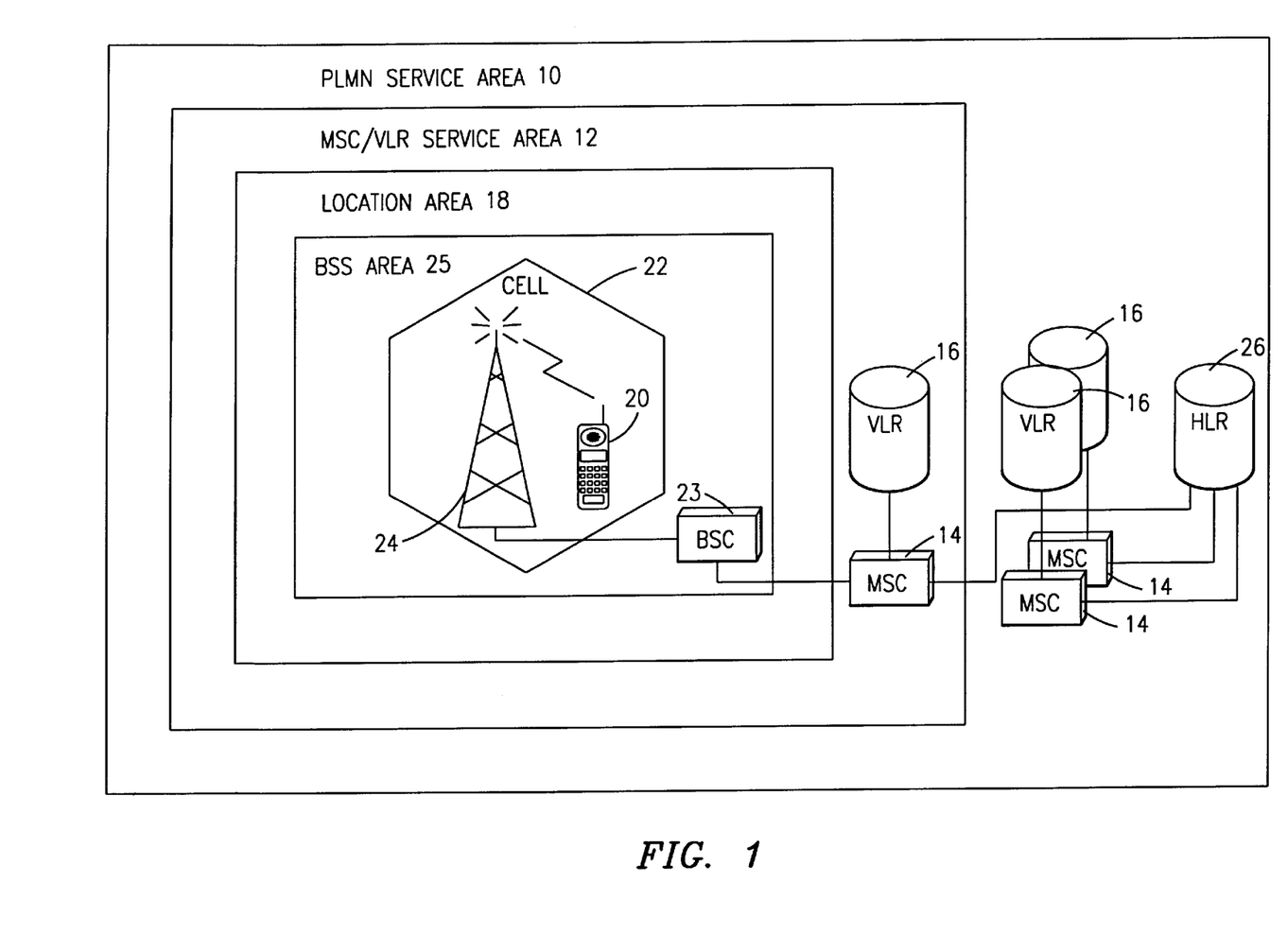
FIG. 1 is a block diagram of a conventional wireless telecommunications system.

With reference now to FIG. 1 of the drawings, there is illustrated a GSM Public Land Mobile Network (PLMN), such as wireless network 10, which in turn is composed of a plurality of areas 12, each with a Mobile Services Switching Center (MSC) 14 and an integrated Visitor Location Register (VLR) 16 therein. The MSC/VLR areas 12, in turn, include a plurality of Location Areas (LA) 18, which are defined as that part of a given MSC/VLR area 12 in which a mobile station (MS) 20 may move freely without having to send update location information to the MSC/VLR area 12 that controls the LA 18. Each Location Area 18 is divided into a number of cells 22. Mobile Station (MS) 20 is the physical equipment, e.g., a car phone or other portable phone, used by mobile subscribers to communicate with the wireless network 10, each other, and users outside the subscribed network, both wireline and wireless.

The MSC 14 is in communication with at least one Base Station Controller (BSC) 23, which, in turn, is in contact with at least one Base Transceiver Station (BTS) 24. The BTS 24 is the physical equipment, illustrated for simplicity as a radio tower, that provides radio coverage to the geographical part of the cell 22 for which it is responsible. It should be understood that the BSC 23 may be connected to several BTSs 24, and may be implemented as a stand-alone node or integrated with the MSC 14. In either event, the BSC 23 and BTS 24 components, as a whole, are generally referred to as a Base Station System (BSS) 25.

With further reference to FIG. 1, the PLMN Service Area or wireless network 10 includes a Home Location Register (HLR) 26, which is a database maintaining all subscriber information, e.g., user profiles, current location information, International Mobile Subscriber Identity (IMSI) numbers, and other administrative information. The HLR 26 may be co-located with a given MSC 14, integrated with the MSC 14, or, alternatively, can service multiple MSCs 14, the latter of which is illustrated in FIG. 1.

The VLR 16 is a database containing information about all of the MSs 20 currently located within the MSC/VLR area 12. If an MS 20 roams into a new MSC/VLR area 12, the VLR 16 connected to that MSC 14 will request data about that MS 20 from its home HLR database 26 (simultaneously informing the HLR 26 about the current location of the MS 20). Accordingly, if the user of the MS 20 then wants to make a call, the local VLR 16 will have the requisite identification information without having to reinterrogate the home HLR 26. In the aforedescribed manner, the VLR and HLR databases 16 and 26, respectively, contain various subscriber information associated with a given MS 20.

The ability of the MS 20 to make and maintain calls depends upon the battery state. When the battery is depleted, the call is dropped. Presently, when a mobile subscriber makes an emergency call, the battery status is not supplied to the emergency center. Therefore, if the call is dropped due to the low battery charge, the emergency operator will not know the reason.

It is, therefore, an object of the present invention to provide a battery status indicator during an emergency call setup.

It is a further object of the present invention to allow a handover to be performed to a reduced power cell for an emergency call when the battery status indicator indicates low battery charge.

SUMMARY OF THE INVENTION

The present invention is directed to telecommunications systems and methods for providing a battery status indicator associated with a calling mobile station (MS) during an emergency call. The battery status indicator is transmitted to the emergency center as a new parameter or as a modified existing parameter, such as cell ID. The emergency center can provide special handling for such calls, such as displaying the low battery indicator to the emergency operator. In addition, the cellular network serving the MS can handover the call to a cell with lower power demands in order to prolong the battery life of the mobile station.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE PRESENTLY PREFERRED EXEMPLARY EMBODIMENTS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 2:
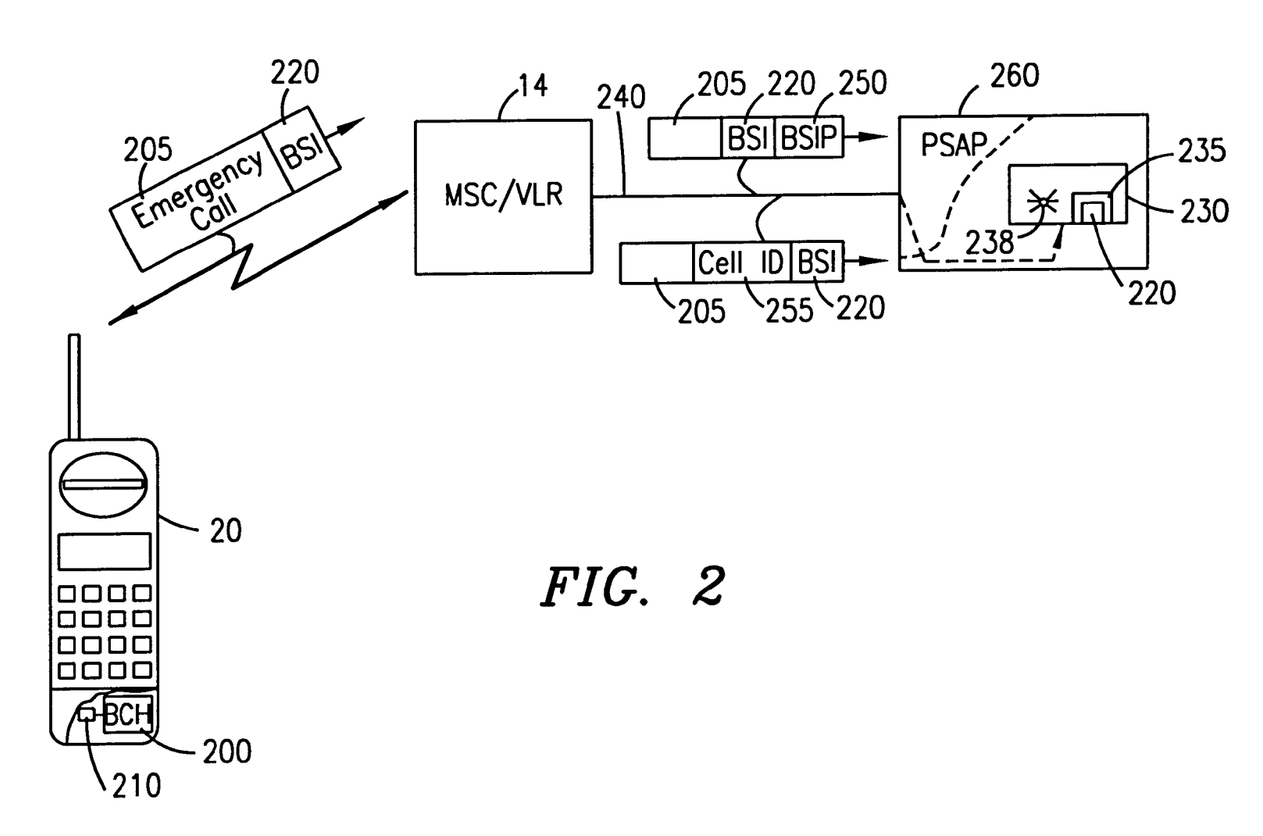
FIG. 2 illustrates the transmission of a battery indicator along with an emergency call setup in accordance with preferred embodiments of the present invention.

With reference now to FIG. 2 of the drawings, in order to provide a battery status indicator 220 associated with a calling mobile station (MS) 20 to an emergency center 260 during an emergency call 205, a monitoring application 210 within the MS 20 monitors the status of a battery 200 associated with the MS 20. Thereafter, when the MS 20 places an emergency call 205, e.g., dials "911", a battery status indicator 220 is determined by the monitoring application 210. The battery status indicator 220, ebb, normal battery or low battery, is included within the emergency call 205 setup procedure towards the emergency center 260, e.g., a Public Safety Answering Point (PSAP), through a serving Mobile Switching Center/Visitor Location Register (MSC/VLR) 14. The PSAP 260 is associated with at least the area served by the MSC/VLR 14.

The MSC/VLR 14 receives the emergency call 205 and battery status indicator 220 from the MS 20 and forwards them to the PSAP 260 via interface 240. The interface 240 to the PSAP 260 can use a multifrequency (MF) protocol or an Integrated Services Digital Network User Part (ISUP) protocol. A new battery status indicator parameter 250 can be attached to the emergency call 205 for delivery across the interface 240, or alternatively, the MSC/VLR 14 can change an existing cell ID parameter 255, which indicates the cell ID of the MS 20, to include the battery status indicator 220 and can send the cell ID parameter 255 and included battery status indicator 220 along with the emergency call 205 across the interface 240 to the PSAP 260. For example, the MSC/VLR 14 can append an extra digit to the cell ID parameter 255 to include the battery status indicator 220, e.g., "0" indicates normal battery, while "1" indicates low battery. Advantageously, by modifying the cell ID parameter 255, no interface changes are required.

The battery status indicator 220 allows the PSAP 260 to provide special handling for low battery calls, such as displaying the low battery indicator 220 on a display 235 of an emergency station 230 to the emergency operator. In addition, the PSAP 260 can expedite the call by providing a signal 238, such as a tone, message or flashing light, the latter being illustrated, on the emergency station 230 to the emergency operator indicating that the received emergency call 205 with the low battery indicator 220 should be handled next in order to prevent subscriber disconnection before the operator response.

Alternatively, the MS 20 can provide the battery status indicator 220 to the PSAP 260 via the MSC/VLR 14 during the emergency call itself. For example, if during the emergency call, the monitoring application 210 determines that the battery 200 has become low, the MS 20 can send a Short Message Service (SMS) message or Unstructured Supplementary Service Data (USSD) message, which includes the low battery indicator 220, towards the MSC/VLR 14, which can, in turn, forward the low battery indicator 220 to the PSAP 260 via interface 240, as discussed hereinbefore.

Figure 3:
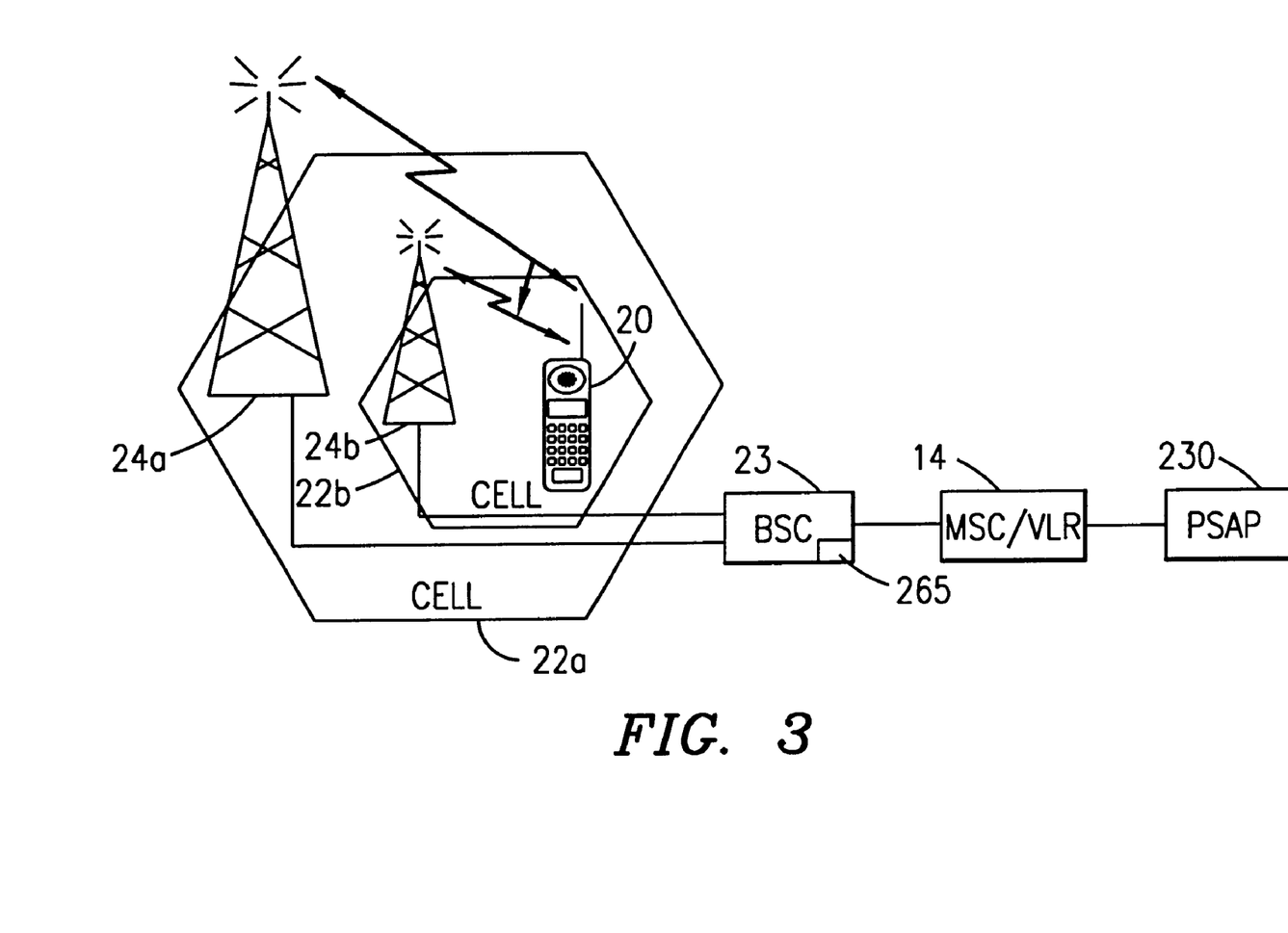
FIG. 3 illustrates a handover of an emergency call to a cell with lower power requirements based upon a received low battery indicator in accordance with embodiments of the present invention.

In another aspect of the invention, as shown in FIG. 3 of the drawings, the MSC/VLR 14 can optionally handover the emergency call 205 (shown in FIG. 2) to another cell 22b with lower power requirements. For example, the MS 20 may be currently served by a large (umbrella) cell 22a with high power level requirements. If another cell 22b serving the area that the MS 20 is located in has lower power requirements, the MS 20 making the emergency call 205 can be handed over to the other cell 22b in order to prolong the battery 200 (shown in FIG. 2) life. As shown in FIG. 3 of the drawings, the cell size of the other cell 22b is smaller than the cell size of the umbrella cell 22a. Smaller cell size means that MS's 20 within the smaller cell 22b can transmit with lower power, since the MS's 20 are relatively closer to a Base Transceiver Station (BTS) 24b serving the smaller cell 22b. Thus, by handing over the emergency call 205 to the smaller cell 22b, the power requirements are reduced, which can increase the battery 200 life.

The handover process in a Global System for Mobile (GSM) Communications System is a mobile assisted handover (MAHO). The MS 20 assists in the handover process by taking quality and received signal strength measurements for the currently serving (umbrella) cell 22a and received signal strength measurements for the neighboring and overlapping cells 22b and reports these measurements to the BTS 24a serving the current (umbrella) cell. These measurements are reported to a Base Station Controller (BSC) 23 connected to the BTS 24a.

Once the MSC/VLR 14 receives the low battery indicator 220 (shown in FIG. 2) and the BSC 23 determines that another cell 22b with lower power requirements is available based upon the signal strength measurements provided by the MS 20, the MSC/VLR 14 initiates the handover process. If, as shown in FIG. 3 of the drawings, the new cell 22b is within the MSC/VLR 14 area and is served by the same BSC 23 as the currently serving (umbrella) cell 22a, an intra-BSC handover is performed, in which the signaling is limited to the BSC 23 and does not involve the MSC/VLR 14.

Figure 4:
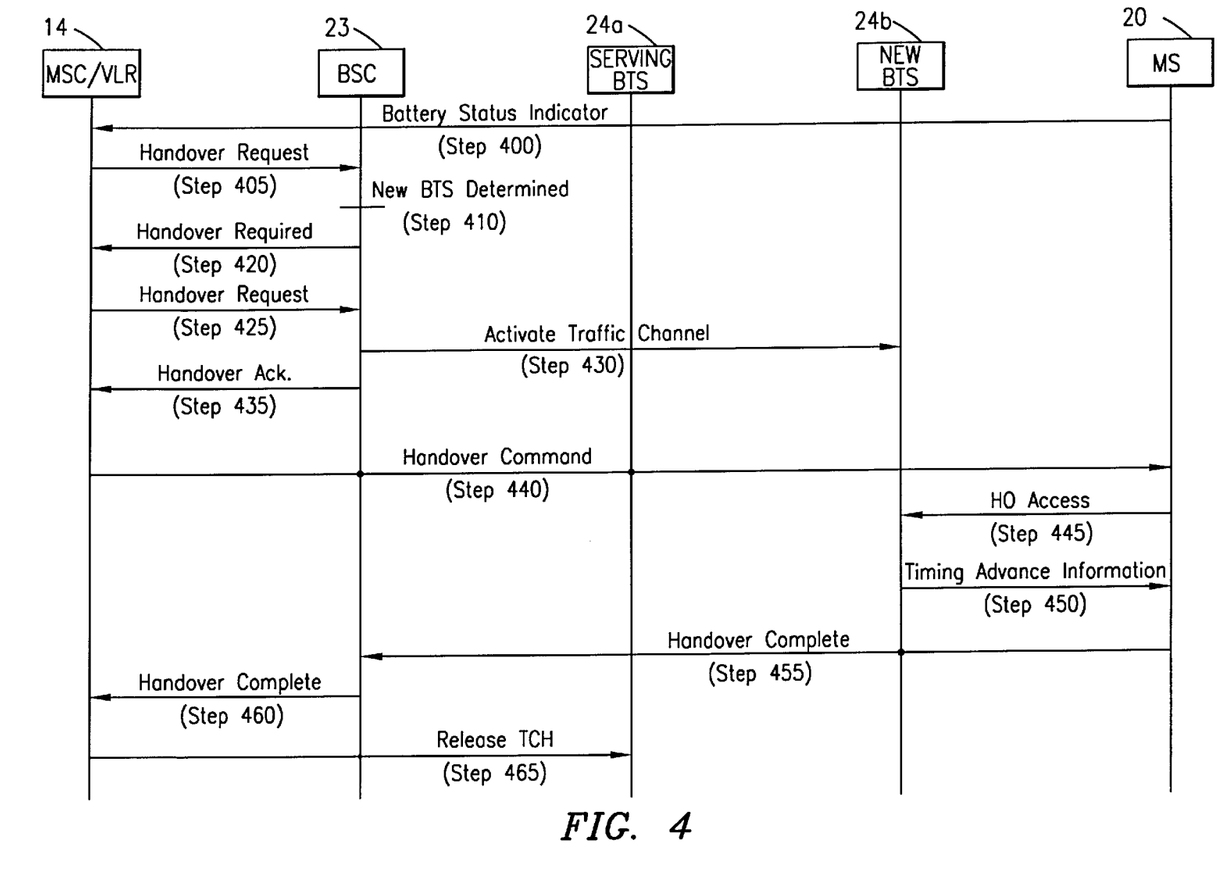
FIG. 4 illustrates a handover between cells served by the same Base Station Controller (BSC)

As shown in FIG. 4 of the drawings, during an intra-BSC handover, after the MSC/VLR 14 receives the low battery indicator 220 from the MS 20 (step 400), the MSC/VLR 14 sends a new handover request message to the serving BSC 23 (step 405), which instructs the BSC 23 to perform a handover based upon power criteria. The BSC 23 utilizes the signal strength measurements provided by the MS 20 to determine all possible cells 22 that the MS 20 could be handed over to. Thereafter, the BSC 23 compares power requirement information 265, which includes the power requirements of each potential handover cell 22b, with the power requirements of the serving cell 22a to determine whether the call can be handed over to another cell 22b with lower power requirements (step 410). The power requirement information 265 can either be stored, for example, as a table, in the BSC 23 or provided to the BSC 23 by the MS 20 along with the quality and signal strength measurement information. If more than one potential handover cell 22b has lower power requirements than the serving cell 22a, the BSC 23 selects either the cell 22b with the lowest power requirement or the cell 22b with the best quality measurement provided to the BSC 23 by the MS 20. If there is not a potential handover cell 22b that has a lower power requirement (step 410), the BSC 23 sends a Handover Rejected message (not shown) to the MSC/VLR 14. However, if the BSC 23 does determine that a handover cell 22b with lower power requirements exists (step 410), the BSC 23 sends a Handover Required message to the MSC/VLR 14 (step 420), which contains the cell ID of the preferred handover cell 22b. Upon receipt of the Handover Required message (step 420), the MSC/VLR 14 transmits a Handover request message to the serving BSC 23 (step 425). Thereafter, the serving BSC 23 orders the new BTS 24b serving the handover cell 22b to activate a traffic channel (TCH) (step 430). Once the new BTS 24b has allocated the new traffic channel (step 430), the BSC 23 sends a Handover Request acknowledgement message back to the MSC/VLR 14 (step 435). In response to the acknowledgement message (step 435), the MSC/VLR 14 sends a Handover Command message to the MS 20 (step 440) via the currently serving BSC 23a and BTS 24a containing information about the frequency and time slot to change to and the power output required for the new BTS 24b. The MS 20 tunes to the new frequency and transmits a Handover access message in the correct new time slot to the new BTS 24b (step 445). When the new BTS 24b receives the Handover access message (step 445), the new BTS 24b sends the MS 20 timing advance information (step 450), which indicates to the MS 20 the amount of time in advance that the MS 20 must transmit information to the new BTS 24b in order for the transmitted information to be received in the proper time slot. Thereafter, the MS 20 sends a Handover Complete message to the BSC 23 via the new BTS 24b (step 455). The BSC 23 forwards the Handover Complete message to the MSC/VLR 14 (step 460). Thereafter, the MSC/VLR 14 informs the old BTS 24a via the BSC 23 to release the old TCH (step 465).

Figure 5:
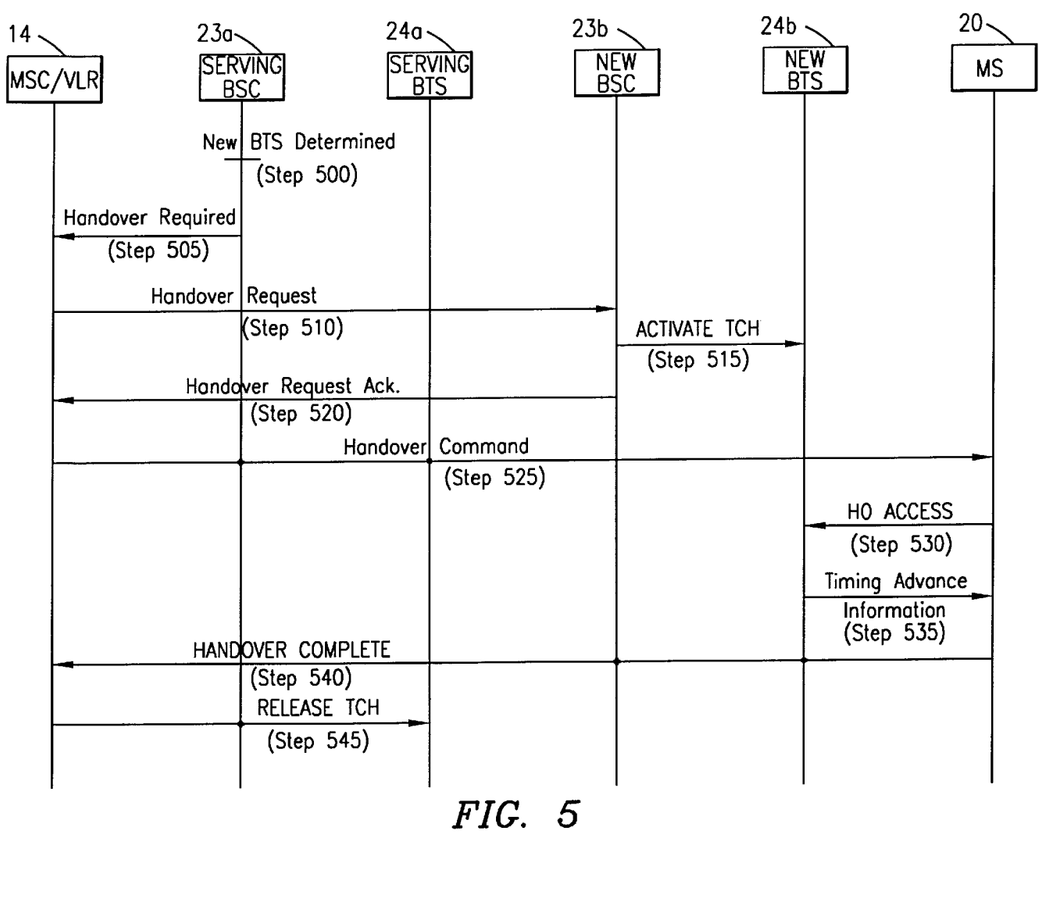
FIG. 5 illustrates a handover between cells served by different BSC's.

However, if the new cell 22b is served by a different BSC 23, an inter-BSC handover is required. For example, as shown in FIG. 5 of the drawings, after the serving BSC 23a determines the handover cell 22b (step 500), the serving BSC 23a transmits a Handover Required message, which includes the cell ID of the handover cell 22b, to the MSC/VLR 14 (step 505). Thereafter, the MSC/VLR 14 sends a Handover request message to the new BSC 23b (step 510). The new BSC 23b orders the new BTS 24b to activate a TCH (step 515). Once the new BTS 24b has allocated the new TCH (step 515) the new BTC 23b transmits a Handover Request acknowledgement message to the MSC/VLR 14 (step 520), which, in turn, sends a Handover command message to the MS 20 (step 525) via the currently serving BSC 23a and currently serving BTS 24a containing information about the frequency and time slot to change to and the power output requirements of the new BTS 24b. The MS 20 tunes to the new frequency and transmits a Handover access message in the correct time slot to the new BTS 24b (step 530). When the new BTS 24b receives the Handover access message (step 530), the new BTS 24b sends the MS 20 timing advance information (step 535). Thereafter, the MS 20 sends a Handover Complete message to the MSC/VLR 14 via the new BSC 23b and new BTS 24b (step 540). The MSC/VLR 14 orders the old BSC 23a and old BTS 24a to release the old TCH (step 545).

Figure 6:
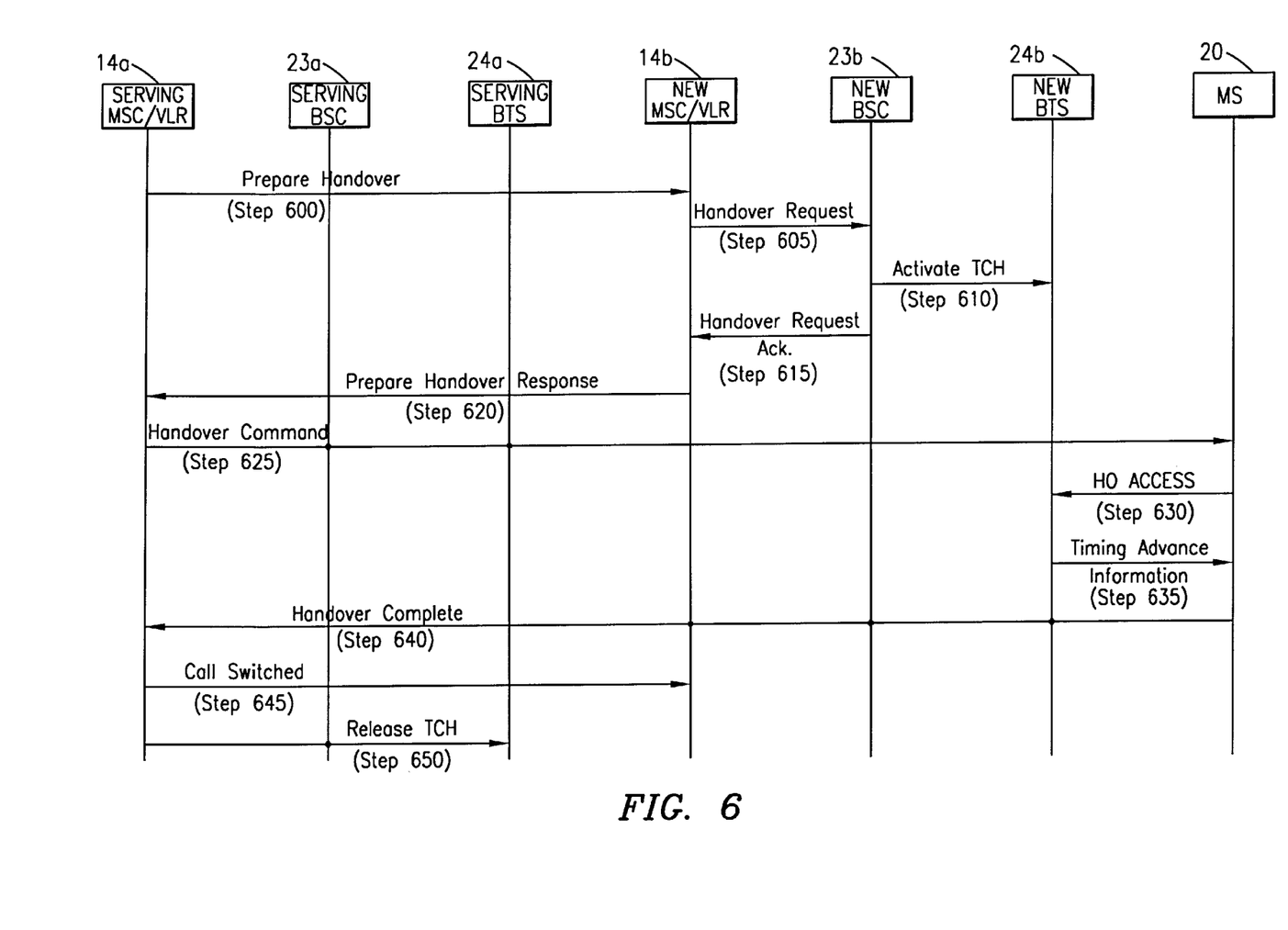
FIG. 6 illustrates a handover between cells served by different Mobile Switching Centers.

In a further alternative embodiment, as shown in FIG. 6 of the drawings, if the new cell 22b is within a different MSC/VLR 14 area, an inter-MSC handover must be performed. The serving MSC/VLR 14a sends a MAP Prepare Handover message to the new MSC/VLR 14b (step 600), which requests the new MSC/VLR 14b to allocate a handover number in order to reroute the call. Upon receipt of the Prepare Handover message (step 600), the new MSC/VLR 14b obtains the handover number and sends a Handover request to the new BSC 23b (step 605), which, in turn, orders the new BTS 24b to activate a TCH (step 610). Once the new BTS 24b has allocated the new TCH (step 610), the new BSC 23b transmits a Handover Request acknowledgement message (step 615), which includes frequency, time slot and power information, to the new MSC/VLR 14b. The new MSC/VLR 14b transmits this information along with the handover number in a MAP Prepare Handover response message to the currently serving MSC/VLR 14a (step 620).

The currently serving MSC/VLR 14a sends a Handover command (step 625), which contains information about the frequency and time slot to use and the power output requirements of the new BTS 24b, to the MS 20 via the Aserving BSC 23a and BTS 24a. The MS 20 tunes to the new frequency and transmits a Handover access message to the new BTS 24b (step 630). When the new BTS 24B receives the Handover access message (step 630), the new BTS 24b sends timing advance information to the MS 20 (step 635). Thereafter, the MS 20 sends a Handover Complete message to the old MSC/VLR 14a via the new BSC 23b and new MSC/VLR 14b (step 640). Finally, the call is switched through from the old MSC/VLR 14a to the new MSC/VLR 14b using the handover number (step 645), and the old MSC/VLR 14a orders the old BSC 23a and old BTS 24a to release the old TCH (step 650).

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

What is claimed is:

1. A telecommunications system for handling an emergency call within a wireless telecommunications system, comprising:

a mobile station having a battery associated therewith, said mobile station having monitoring means therein for monitoring the status of said battery and generating a battery status indicator associated with the status of said battery when said mobile station places an emergency call;

a mobile switching center in wireless communication with said mobile station, said mobile switching center receiving said emergency call and said battery status indicator from said mobile station;

a first base transceiver station in wireless communication with said mobile station and connected to said mobile switching center, said first base transceiver station having a first power output requirement;

a second base transceiver station having a second power output requirement, said mobile switching center instructing said first base transceiver station to perform a handover of said emergency call to said second base transceiver station when said second power output requirement is lower than said first power output requirement and said received battery status indicator indicates low battery power; and an emergency node in communication with said mobile switching center, said emergency node receiving said emergency call and said battery status indicator from said mobile switching center, said emergency node handling said emergency call based upon said battery status indicator.

2. The telecommunications system of claim 1, wherein said battery status indicator indicates low battery power.

3. The telecommunications system of claim 2, further comprising:

an emergency station within said emergency node having a display thereon, said battery status indicator being provided on said display.

4. The telecommunications system of claim 2, further comprising:

an emergency station within said emergency node; and a signal indicating said battery status indicator, said emergency node providing said signal to said emergency station.

5. The telecommunications system of claim 1, further comprising:

a base station controller connected to said first base transceiver station, said base station controller receiving said first and second power output requirement, comparing said first and second power output requirement to determine said second power output requirement is lower than said first power output requirement and instructing said mobile switching center to instruct said first base transceiver station to perform said handover.

6. The telecommunications system of claim 1, wherein said mobile switching center further forwards a cell ID parameter to said emergency node, said battery status indicator being included within said cell ID parameter.

7. The telecommunications system of claim 1, wherein said mobile switching center further forwards to said emergency node a battery status indicator parameter, said battery status indicator being included within said battery status indicator parameter.

8. The telecommunications system of claim 1, wherein said emergency node is a Public Safety Answering Point.

9. A method for handling an emergency call within a wireless telecommunications system, comprising the steps of:

monitoring the status of a battery associated with a mobile station;

generating a battery status indicator associated with the status of said battery;

placing an emergency call by said mobile station, said emergency call having said battery status indicator included therewith;

receiving, by a mobile switching center in wireless communication with said mobile station, said emergency call and said battery status indicator from said mobile station;

determining a first power output requirement associated with a first base transceiver station in wireless communication with said mobile station and connected to said mobile switching center and a second power output requirement associated with a second base transceiver station;

instructing, by said mobile switching center, said first base transceiver station to perform a handover of said emergency call to said second base transceiver station when said second power output requirement is lower than said first power output requirement and said received battery status indicator indicates low battery power;

receiving, by an emergency node in communication with said mobile switching center, said emergency call and said battery status indicator from said mobile switching center; and handling, by said emergency node, said emergency call based upon said battery status indicator.

10. The method of claim 9, further comprising the step of:

displaying on an emergency station within said emergency node, said battery status indicator when said battery status indicator indicates low battery.

11. The method of claim 9, further comprising the step of:

providing a signal on an emergency station within said emergency node indicating said battery status indicator when said battery status indicator indicates low battery.

12. The method of claim 9, wherein said step of determining further comprises the steps of:

receiving, by a base station controller connected to said first base transceiver station, said first and second power output requirement;

comparing, by said base station controller, said first and second power output requirement to determine said second power output requirement is lower than said first power output requirement; and instructing, by said base station controller, said mobile switching center to instruct said first base transceiver station to perform said handover.

13. The method of claim 9, further comprising the step of:

including said battery status indicator within a cell ID parameter transmitted via an interface between said mobile switching center and said emergency node.

14. The method of claim 9, further comprising the step of:

including said battery status indicator within a battery status indicator parameter transmitted via an interface between said mobile switching center and said emergency node.

15. A telecommunications system for handling an emergency call within a wireless telecommunications system, comprising:

a mobile station being served by a serving cell and having a battery associated therewith, said mobile station being capable of generating a battery status indicator associated with the status of said battery;

a base station controller in wireless communication with said mobile station, said base station controller being capable of receiving an emergency call and said battery status indicator from said mobile station, said base station controller further being capable of instructing said mobile station to perform a handover to a select one of at least one potential handover cell if power output requirements associated with said select handover cell are lower than power output requirements associated with said serving cell when said battery status indicator indicates low battery power; and an emergency node in communication with said base station controller, said emergency node being capable of receiving said emergency call and said battery status indicator from said base station controller, said emergency node handling said emergency call based upon said battery status indicator.

16. The telecommunications system of claim 15, wherein said base station controller has a memory therein for storing said power output requirements for said serving cell and said power output requirements for each of said at least one potential handover cells.

17. The telecommunications system of claim 15, wherein said power output requirements of more than one of said at least one potential handover cells are lower than said power output requirements of said serving cell, said base station controller further being capable of receiving quality and signal strength measurement from said mobile station for said serving cell and said at least one potential handover cell, said select handover cell having the highest quality and signal strength measurements of all of said at least one potential handover cells having power output requirements lower than said power output requirements of said serving cell.

* * * * *

UNITED STATES PATENT AND TRADEMARK OFFICE
CERTIFICATE OF CORRECTION

PATENT NO. : 6,408,172 B1 Page 1 of 1
DATED : June 18, 2002
INVENTOR(S) : Vladimir Alperovich et al.

It is certified that error appears in the above-identified patent and that said Letters Patent is hereby corrected as shown below:

<u>Column 3,</u>
Line 13, replace "ebb" with --e.g. --

<u>Column 6,</u>
Line 1, replace "Aserving" with -- serving --

Signed and Sealed this

Twenty-ninth Day of October, 2002

*Attest:*

JAMES E. ROGAN
*Attesting Officer* *Director of the United States Patent and Trademark Office*